United States Patent
Kawano (10) Patent No.: US 6,759,345 B2
(45) Date of Patent: Jul. 6, 2004

(54) METHOD OF MANUFACTURING A SEMICONDUCTOR DEVICE INCLUDING ETCHING OF A PERIPHERAL AREA BEFORE CHEMICAL-MECHANICAL POLISHING

(75) Inventor: Hiroyuki Kawano, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 73 days.

(21) Appl. No.: 10/062,505

(22) Filed: Feb. 5, 2002

(65) Prior Publication Data

US 2002/0127870 A1 Sep. 12, 2002

(30) Foreign Application Priority Data

Mar. 9, 2001 (JP) .................................... 2001-065884

(51) Int. Cl.$^7$ ............................................... H01L 21/31
(52) U.S. Cl. ..................................... 438/759; 438/778
(58) Field of Search ............................... 438/758, 759, 438/778, 745; 216/2, 41, 83

(56) References Cited

U.S. PATENT DOCUMENTS 5,578,402 A * 11/1996 Watanabe ....................... 430/5
6,117,778 A * 9/2000 Jones et al. .................. 438/692

* cited by examiner

Primary Examiner—Evan Pert
Assistant Examiner—Scott B. Geyer
(74) Attorney, Agent, or Firm—Volentine Francos, PLLC (57) ABSTRACT

A method of manufacturing a semiconductor device includes the formation of a dielectric film on a substrate having an effective device area surrounded by a peripheral area. A resist pattern exposing part of the dielectric film in the peripheral area is formed, and the dielectric film is etched to reduce the thickness of the exposed part. After the resist pattern has been removed, the dielectric film is planarized by chemical-mechanical polishing. Good planarity is achieved because the etching step removes high parts of the dielectric film from the peripheral area. This method of achieving improved planarity is less expensive than conventional methods employing dummy devices.

11 Claims, 8 Drawing Sheets

METHOD OF MANUFACTURING A SEMICONDUCTOR DEVICE INCLUDING ETCHING OF A PERIPHERAL AREA BEFORE CHEMICAL-MECHANICAL POLISHING

BACKGROUND OF THE INVENTION

1. Field of the Invention

The present invention relates to an improved method of manufacturing a semiconductor device, more particularly to an improved method including a chemical-mechanical polishing step for planarizing a dielectric film.

2. Description of the Related Art

Semiconductor devices are commonly manufactured by processing a semiconductor wafer to simultaneously form a plurality of devices, each of which may be referred to as a die or a chip. The processing steps include the formation of dielectric films, typically oxide films, for various purposes, such as filling in trenches in the wafer, or insulating layers of metal wiring.

When a dielectric film is formed, it may have an uneven surface topography, mimicking the underlying pattern of trenches or wires. To provide a sufficiently flat surface on which to form the next layer, it is often necessary to planarize the dielectric film by chemical-mechanical polishing (CMP). When conventional methods are used, the planarization performance is known to depend strongly on the density of the underlying trench or wiring pattern.

Figure 1:
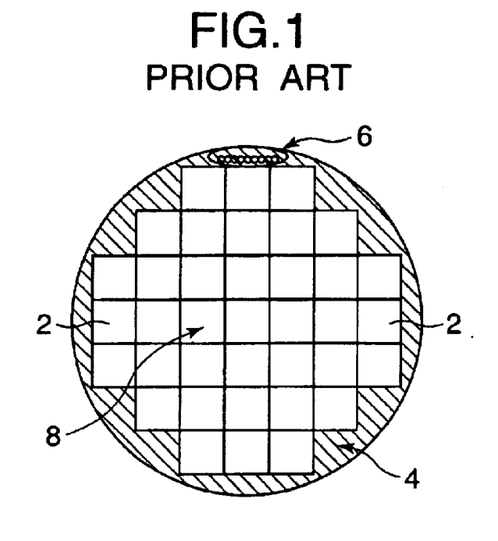
FIG. 1 is a plan view of a semiconductor wafer.

FIG. 1 shows an example of a semiconductor wafer on which a plurality of chips 2 are being formed. The chips 2 are surrounded by a peripheral area 4 which is featureless except for a marking 6, written by a laser beam, used for identification of the wafer lot. The area occupied by the chips 2 will be referred to as the effective device area 8. The effective device area 8 is separated from the peripheral area 4 by grid lines 10 approximately one hundred micrometers (100 µm) wide, as shown in FIGS. 2 and 3.

Figure 2:
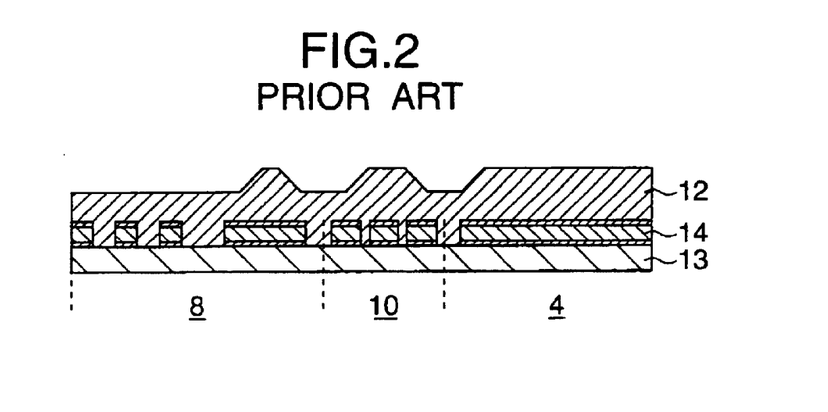
FIG. 2 is a partial sectional view of the semiconductor wafer in FIG. 1, showing an inter-layer dielectric film.

FIG. 2 illustrates the wafer after deposition of an interlayer dielectric film 12: either an inter-metal dielectric (IMD) film or a pre-metal dielectric (PMD) film. The substrate 13 shown in FIG. 2 may be either another dielectric film or the semiconductor (e.g., silicon) wafer substrate. Even if this substrate 13 has a perfectly flat surface, the topography of the IMD or PMD film 12 includes vertical steps of approximately the same height as those in the wiring layer 14 formed on the substrate 13. The average thickness of the dielectric film 12 is greatest in the peripheral area 4, where the pattern density of the wiring layer 14 approaches one hundred percent (100%), and is least in the highly patterned effective device area 8.

Figure 3:
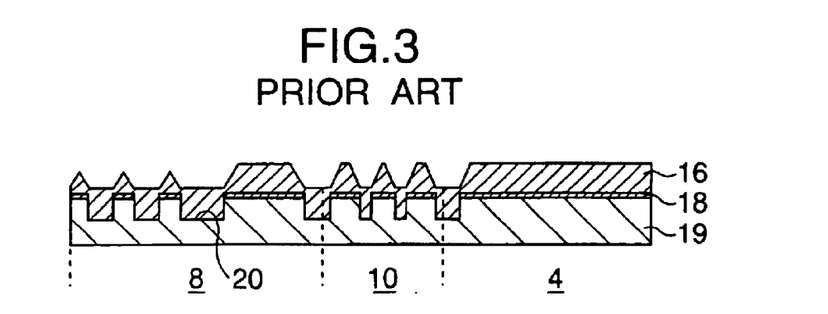
FIG. 3 is another partial sectional view of the semiconductor wafer in FIG. 1, showing a shallow trench isolation film.

FIG. 3 illustrates the wafer at an earlier processing stage, after deposition of a shallow trench isolation (STI) dielectric (oxide) film 16. The topography of the STI film 16 includes vertical steps of approximately the same height as the trench depth, this depth being measured from the top of a nitride film 18, which is used as a mask when the trenches are etched in the semiconductor substrate 19, to the bottoms of the etched trenches 20. Once again, the average thickness of the dielectric film 16 is greatest in the peripheral area 8 and least in the effective device area 4.

Figure 4:
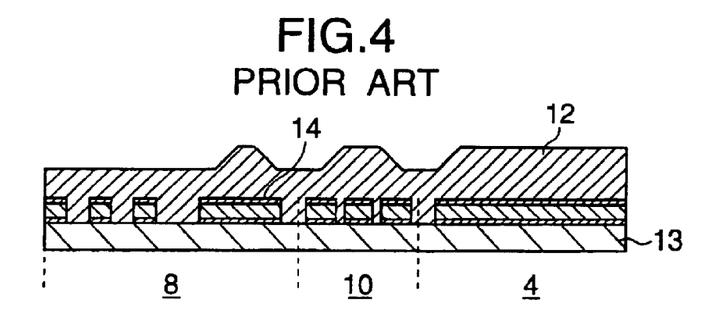
FIGS. 4, 5, 6, and 7 illustrate conventional chemical-mechanical polishing of the dielectric film in FIG. 2.
Figure 5:
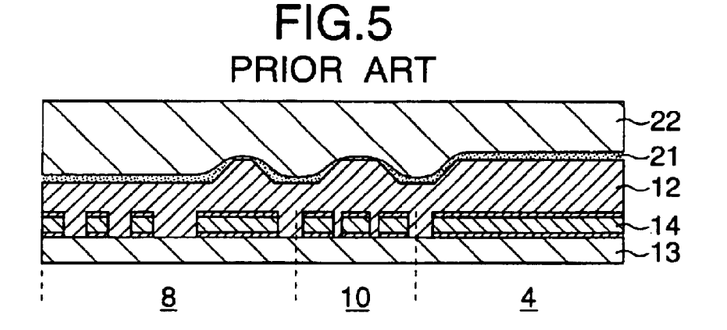
Figure 6:
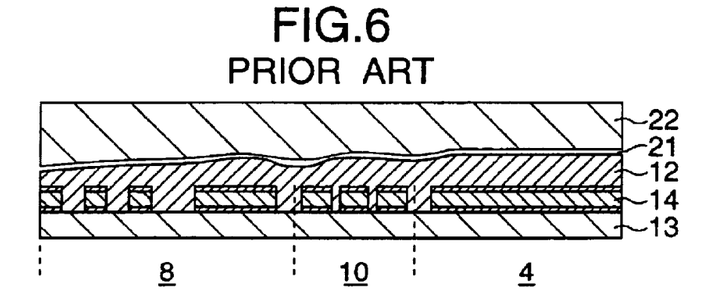
Figure 7:
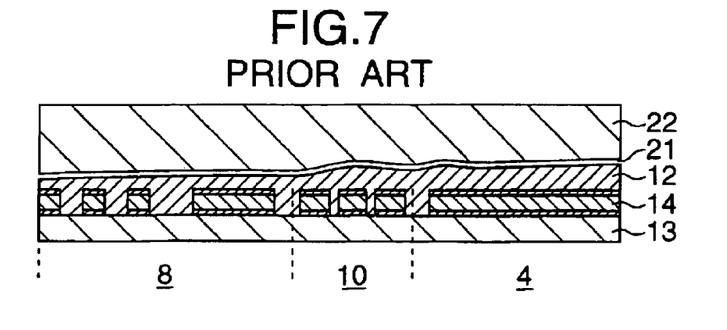

FIGS. 4 to 7 illustrate the chemical-mechanical polishing of the IMD or PMD film 12 in FIG. 2. FIG. 4, which is identical to FIG. 2, shows the starting state. In FIG. 5, a slurry 21 is dripped onto the dielectric film 12, an elastic polishing pad 22 is pressed against the oxide film 12, and the dielectric film 12 is polished with a rotary motion. The polishing pad 22 is deformed by the topography of the dielectric film 12, giving rise to local variations in polishing pressure. Higher parts of the dielectric film 12 are polished faster than lower parts, so the polishing process smoothes out the topography of the dielectric film 12, as shown in FIG. 6. Despite this, the average thickness of the material to be removed in the peripheral area 4 is so much greater than the average thickness in the effective device area 8 that at the end of the polishing process, the surface of the dielectric film 12 remains higher in the peripheral area 4 than in the effective device area 8, as shown in FIG. 7.

The polishing process is controlled to reduce the dielectric film 12 to a predetermined thickness in the effective device area 8. The thickness of the dielectric film 12 in the peripheral area 4 is not of direct concern, since no devices are formed in this area, but this thickness influences the final thickness achieved in the adjacent grid-line area 10 and in nearby parts of the effective device area 8. Because of its high average thickness, the peripheral area 4 absorbs a disproportionate share of the polishing pressure near the circumference of the wafer, thereby reducing the polishing rate in the outer parts of the effective device area 8. Consequently, as can be seen in FIG. 7, the polished surface of the effective device area 8 is far from flat. Resulting problems include defocusing in subsequent lithography steps and incomplete etching in subsequent etching steps, leading to poor device yields.

One approach to solving these problems is more aggressive polishing, to reduce all areas of the wafer to the same height. Such aggressive polishing, however, risks exposure of the wiring pattern in chips near the center of the wafer.

Figure 8:
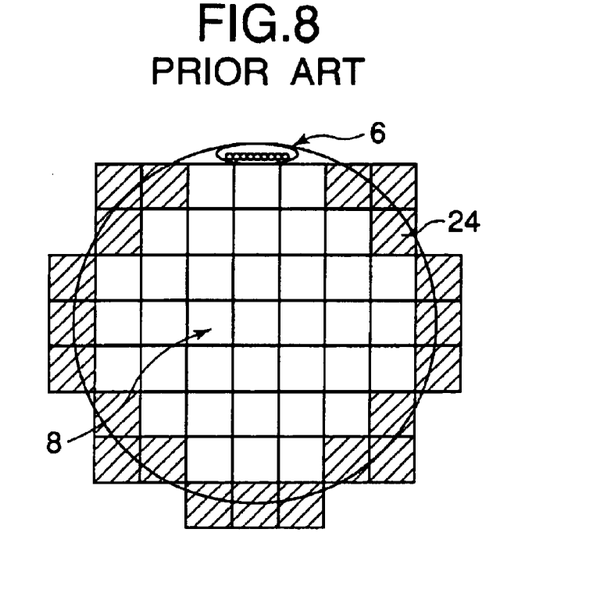
FIG. 8 is a plan view of a semiconductor wafer having dummy chips in its peripheral area.
Figure 9:
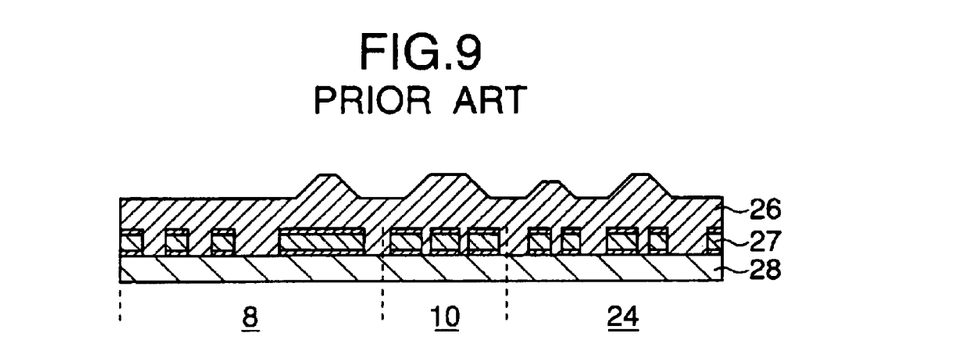
FIG. 9 is a partial sectional view of the semiconductor wafer in FIG. 8, showing an inter-layer dielectric film.
Figure 10:
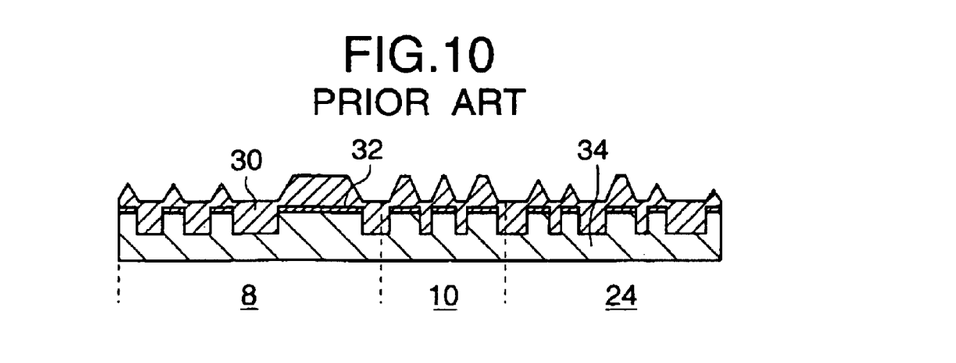
FIG. 10 is another partial sectional view of the semiconductor wafer in FIG. 8, showing a shallow trench isolation film.

Another approach is to surround the effective device area 8 with dummy devices, thereby eliminating the non-patterned peripheral area. FIG. 8 shows an example of a semiconductor wafer in which the effective device area 8 is surrounded by dummy devices or dummy chips 24, except where the marking 6 is formed. The effective device area 8 is separated from the dummy chips 24 by grid lines 10 approximately 100 µm wide, as shown in FIGS. 9 and 10. The dummy chips 24 are patterned with substantially the same pattern density as the effective device area 8.

FIG. 9 shows an IMD or PMD film 26 covering a wiring pattern 27 formed on a substrate 28 (either an underlying dielectric film or the semiconductor wafer substrate). FIG. 10 shows an STI dielectric (oxide) film 30 formed on a nitride film 32 on a silicon wafer substrate 34. In both cases, since the pattern density is the same in the dummy chips 24 as in the effective device area 8, the average thickness of the dielectric film is substantially the same in these two areas 8, 24.

Figure 11:
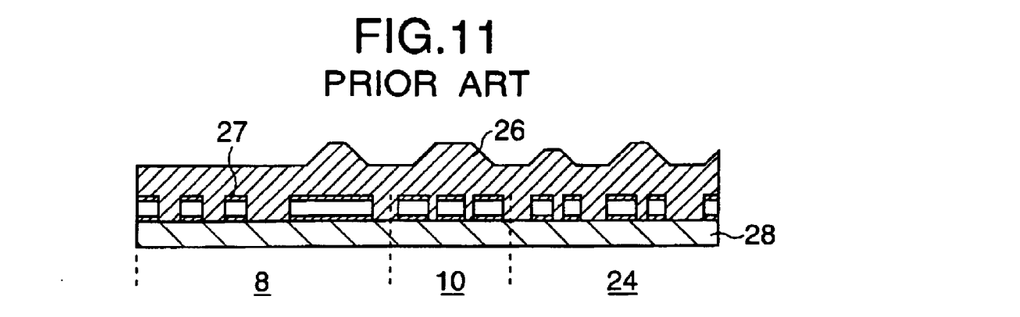
FIGS. 11, 12, 13, and 14 illustrate conventional chemical-mechanical polishing of the dielectric film in FIG. 9.
Figure 12:
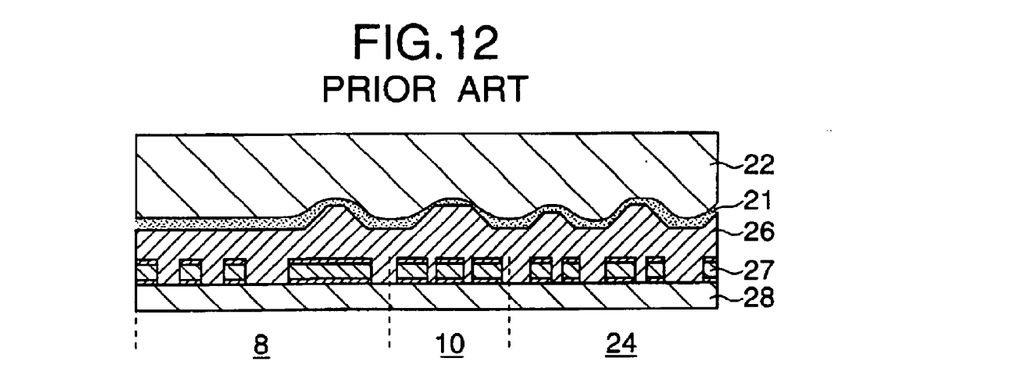
Figure 13:
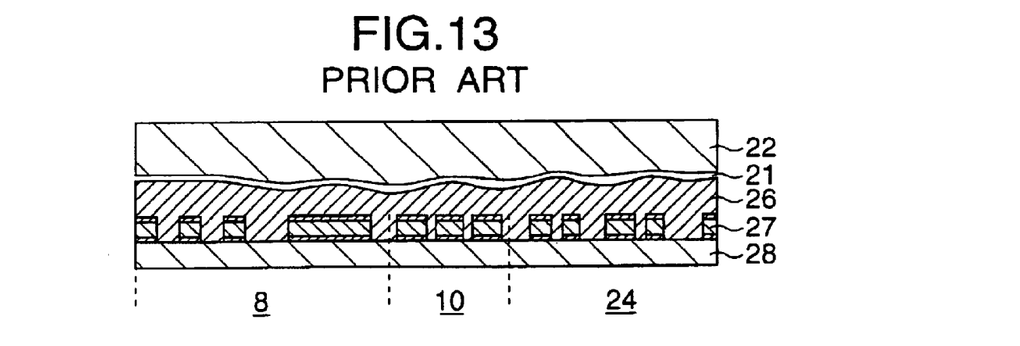
Figure 14:
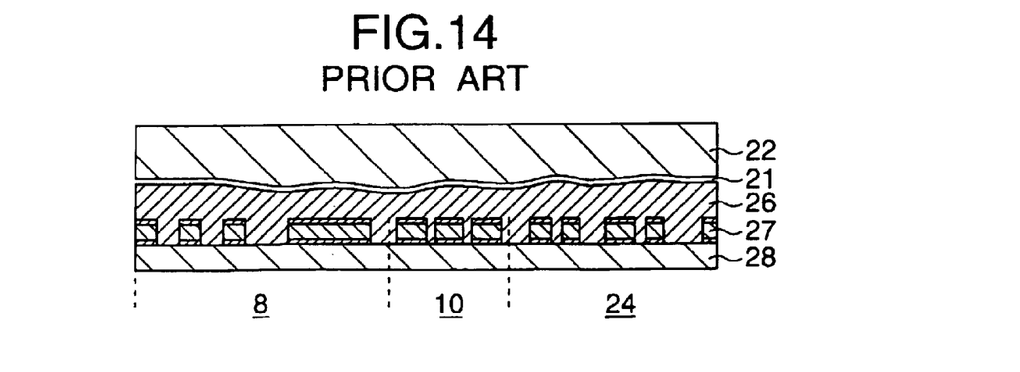

FIGS. 11 to 14 illustrate the chemical-mechanical polishing of the IMD or PMD film 26 in FIG. 9. FIG. 11 shows the state before polishing begins; the topography of the IMD or PMD film 26 mimics the wiring pattern 27 below. FIG. 12 illustrates the start of the polishing process, showing the polishing pad 22 and slurry 21. FIG. 13 illustrates a later stage in the polishing process, showing that the dummy chips 24 are polished at substantially the same rate as the effective device area 8. FIG. 14 illustrates the end of the polishing process. The dummy chips 24 have substantially no effect on the final thickness of the dielectric film 26 in the effective device area 8, and a satisfactory degree of planarity is achieved.

Semiconductor wafers with dummy chips are now in general use for the manufacture of semiconductor devices on fabrication lines in which chemical-mechanical polishing is employed. Dummy chips do not completely eliminate uneven planarization, however, and they introduce a serious new problem.

The reason why dummy chips do not completely eliminate uneven planarization is that no dummy chips are formed in the wafer area where the marking 6 is written. The visibility of the marking would be impaired if it were to be overwritten on a patterned dummy-chip area. Accordingly, planarization irregularities tend to persist in chips located near the marking.

The new problem introduced by the dummy chips is that much additional processing is needed to pattern them. This is particularly true in lithography steps carried out with exposure apparatus of the step-and-repeat type (e.g., with a stepper apparatus). Since the dummy chips will not become products, the time spent processing them reduces the productivity of the manufacturing process, and increases the cost of ownership (CoO) of the processing equipment, including personnel costs. Since the dummy chips are numerous, and since they have to be patterned anew before each chemical-mechanical polishing step in the fabrication process, the impact on productivity and cost is considerable, and the capability of the fabrication line for high-volume production is impaired.

SUMMARY OF THE INVENTION

An object of the present invention is to provide an improved method of manufacturing a semiconductor device, such that when the device is planarized by chemical-mechanical polishing, good planarity is obtained without significant negative impact on cost and productivity.

The invented method of manufacturing a semiconductor device includes the steps of:

(a) forming a dielectric film covering a substrate having an effective device area surrounded by a peripheral area;

(b) forming a resist mask, preferably by a single lithography exposure, covering the dielectric film in the effective device area and leaving at least part of the dielectric film exposed in the peripheral area;

(c) etching the exposed part of the dielectric film, preferably by wet etching;

(d) removing the resist mask; and (e) planarizing the dielectric film by chemical-mechanical polishing.

The resist mask formed in step (b) may expose all of the dielectric film beyond a certain distance from the effective device area, or may be patterned to expose only part of the dielectric film beyond this distance.

The invented method yields good planarity by removing high parts of the dielectric film from the peripheral area, so that these parts do not reduce the polishing pressure in the effective device area.

Impact on process cost and productivity is slight, because the resist mask formed in step (b) does not have to be accurately patterned or aligned, and the etching process in step (c) does not have to be tightly controlled.

DETAILED DESCRIPTION OF THE INVENTION

Embodiments of the invention will be described with reference to the attached drawings. In each embodiment, the drawings illustrate a sequence of steps from the formation of a dielectric film on a semiconductor wafer to the planarization of the dielectric film by chemical-mechanical polishing. Detailed descriptions of other steps in the manufacturing process will be omitted, as conventional methods can be used of these steps.

Figure 15:
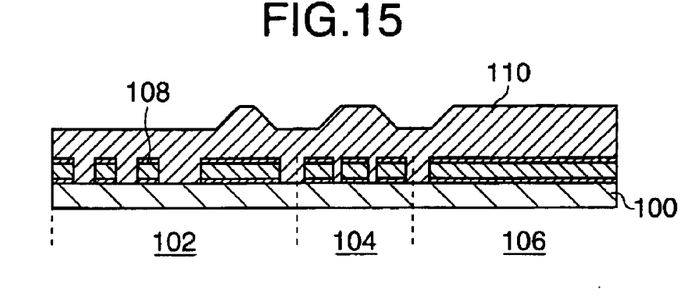
FIGS. 15, 17, 19, and 21 are partial sectional views illustrating the etching and chemical-mechanical polishing of an inter-layer dielectric film according to a first embodiment of the invention.
Figure 16:
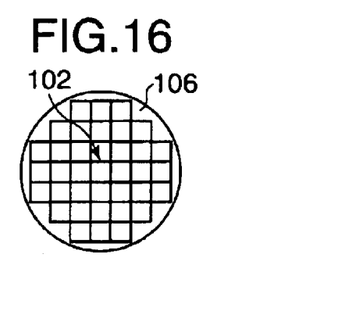
FIGS. 16, 18, and 20 are plan views corresponding to FIGS. 15, 17, and 19, respectively.

Referring to FIG. 15, in a first embodiment of the invention, a semiconductor wafer substrate 100 includes an effective device area 102, which is separated by grid lines 104 from a peripheral area 106. At the processing stage shown, the upper surface of the substrate 100 may be either a semiconductor surface, or the surface of a dielectric film that has been deposited on the wafer. A wiring pattern 108 has been formed on this substrate 100, with a pattern density of substantially 100% in the peripheral area 106 and a lower pattern density in the effective device area 102. A dielectric film 110 (either an IMD film or a PMD film) is formed by deposition of an oxide material, covering the wafer 100 and wiring pattern 108. FIG. 16 is a plan view of the wafer at this stage, showing that there are no dummy chips in the peripheral area 106 surrounding the effective device area 102, and that the peripheral area 106 extends to the periphery of the wafer substrate.

Figure 17:
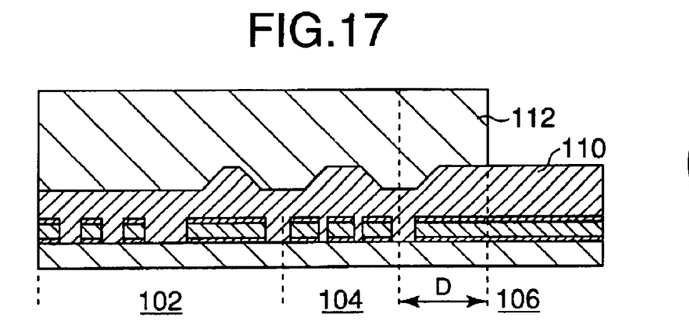
Figure 18:
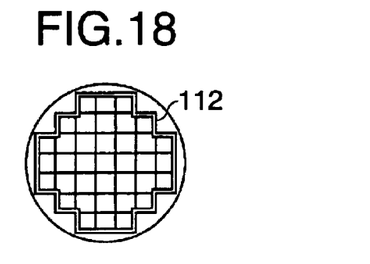

Referring to FIG. 17, the wafer is coated with a layer of a photoresist material, which is patterned by lithography to form a resist pattern 112. The resist pattern 112 covers the entire effective device area 102 and the grid lines 104 but extends only a distance D of about five micrometers (5 μm) beyond the grid lines 104 into the peripheral area 106. The resist pattern 112 entirely covers the peripheral area 106 out to this distance D, and entirely exposes the dielectric film 110 in the rest of the peripheral area 106, beyond the distance D. The distance D does not have to be accurately controlled, so the resist pattern 112 is defined by a single whole-wafer exposure in the lithography step, rather than by a step-and-repeat process. FIG. 18 shows a plan view of the wafer after the resist pattern 112 has been formed.

Figures 19, 20:
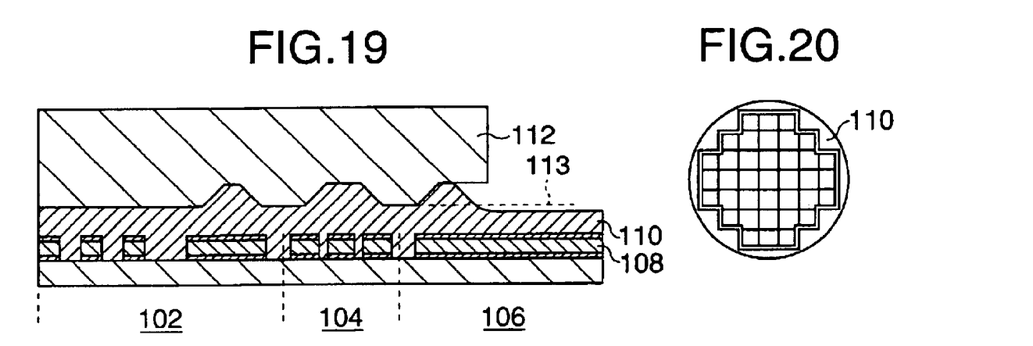

Referring to FIG. 19, a wet etching process is now used to reduce the thickness of the exposed part of the dielectric film 110. Ideally, the thickness is reduced to the reference plane 113 corresponding to the base level (the lowest surface level) of the dielectric film 110 in the effective device area 102, but the etching depth does not have to be controlled accurately, as long as the wiring layer 108 is not exposed. Etching proceeds laterally as well as downward and thus partly undercuts the resist pattern 112, but the overlap of the resist pattern 112 on the peripheral area 106 provides an adequate protective margin, even for wet etching, which is less accurate than other types of etching but is also less expensive. FIG. 20 shows a plan view of the wafer after the dielectric film 110 has been etched.

Figure 21:
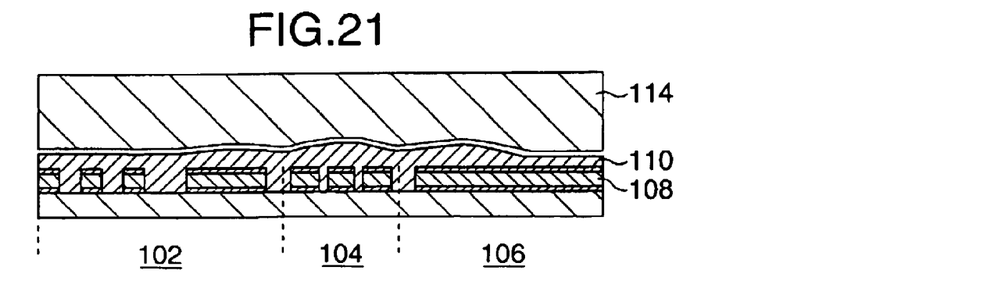

Referring to FIG. 21, the resist pattern 112 is now removed and the dielectric film 110 is planarized by chemical-mechanical polishing, using a polishing pad 114 and a chemical slurry. Because of the preceding etching step, the dielectric film 110 is polished as if the density of the wiring pattern 108 in the peripheral area 106 were nearly zero (0%), even though the actual pattern density in this area approaches 100%. The polishing pressure in the outer parts of the effective device area 102 is therefore not reduced by the effect of the peripheral area 106, and satisfactory planarity is obtained throughout the effective device area 102.

Compared with the use of dummy chips, the manufacturing process described in the first embodiment is quicker and less expensive, because forming and patterning one resist pattern 112 is easier and less time-consuming than patterning the numerous dummy chips used in conventional manufacturing methods. Moreover, when several chemical-mechanical polishing processes are carried out, the same lithography mask can be used to define the resist pattern 112 each time. Furthermore, extreme accuracy is not required in the design and alignment of this mask; a tolerance in excess of one micrometer can be allowed, as compared with the submicron accuracy demanded in typical chip patterning processes. Accordingly, the novel patterning and etching step illustrated in FIGS. 17 and 19 adds only slightly to the cost of the manufacturing process, and does not greatly impede its productivity.

Another advantage of the method described in the first embodiment is that etching the peripheral area 106 does not impair the visibility of the marking written afterward for wafer identification. The etching process can therefore reduce the thickness of the dielectric film all around the wafer, so that all chips in the effective device area 102 can be uniformly polished.

Next, a second embodiment will be described. The second embodiment differs from the first embodiment in that the dielectric film is etched to an uneven topography in the peripheral area.

Figure 22:
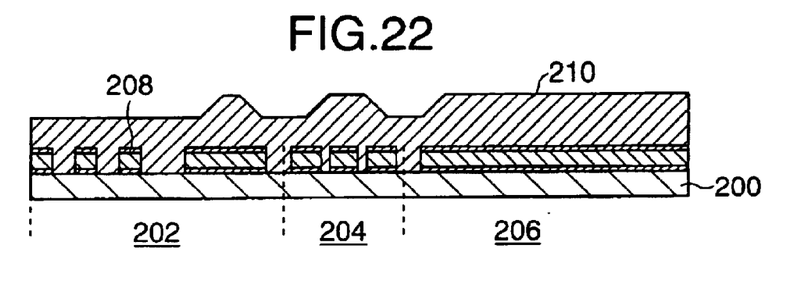
FIGS. 22, 23, 24, and 25 are partial sectional views illustrating the etching and chemical-mechanical polishing of an inter-layer dielectric film according to a second embodiment of the invention.

Referring to FIG. 22, the semiconductor wafer substrate 200 in the second embodiment includes an effective device area 202 separated by grid lines 204 from a peripheral area 206, as in the first embodiment. A wiring pattern 208 is formed on the surface of the substrate 200, with a pattern density of substantially 100% in the peripheral area 206 and a lower pattern density in the effective device area 202. A dielectric film 210 (either an IMD film or a PMD film) is formed by deposition of an oxide material, covering the substrate 200 and wiring pattern 208.

Figure 23:
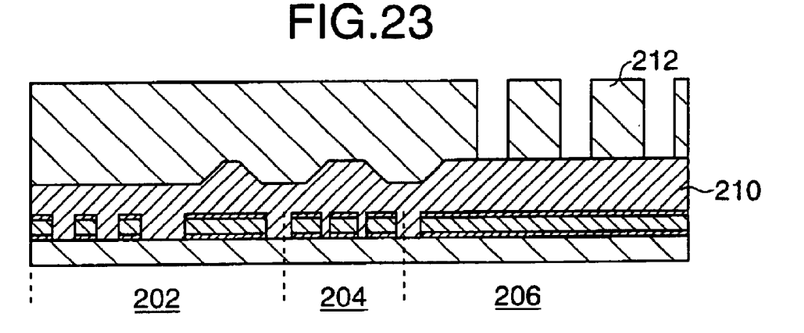

Referring to FIG. 23, the wafer is coated with a layer of a photoresist material, which is patterned by lithography to form a resist pattern 212. The resist pattern 212 covers the entire effective device area 202 and the grid lines 204, extends a short distance (e.g., about 5 μm) over the peripheral area 206, and is patterned over the rest of the peripheral area 206. The pattern may be, for example, a dot pattern or a line pattern. The pattern need not be accurately formed or aligned, but its density should be approximately complementary to the pattern density of the wiring pattern 208 in the effective device area 202. The entire resist pattern 212 can be defined by a comparatively inexpensive lithography procedure covering the whole wafer with a single exposure.

Figure 24:
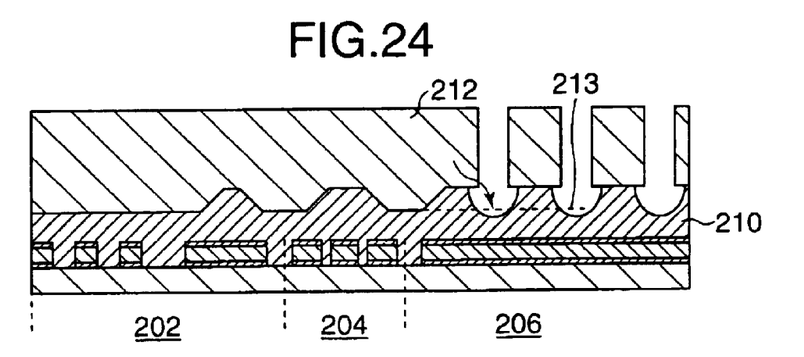

Referring to FIG. 24, the exposed parts of the dielectric film 210 are etched down to approximately the level of the reference plane 213. Although more accurate control of the etching depth is required than in the first embodiment, there is still a tolerance of about fifteen or twenty percent (15%-20%) in terms of the etched thickness of the dielectric film 210, so the etching control requirements are not stringent and an inexpensive wet etching process can be employed. After this etching step, the topography of the dielectric film 210 in the peripheral area 206 is generally similar to that in the effective device area 202, having approximately the same pattern density.

Figure 25:
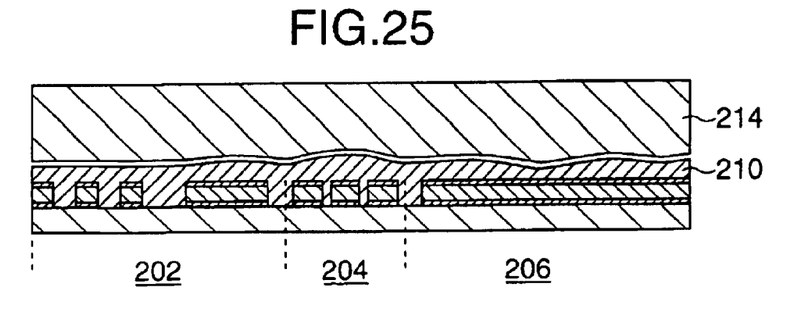

Referring to FIG. 25, after the resist pattern 212 is removed, the dielectric film 210 is planarized by chemical-mechanical polishing, using a polishing pad 214 and slurry. Because of the similar pattern densities of the dielectric film 210 in the effective device area 202 and peripheral area 206, polishing proceeds at a highly uniform rate over the entire wafer surface, and even better planarization is achieved than in the first embodiment.

The effect of the second embodiment is similar to the effect of dummy chips. As explained in the first embodiment, however, formation of the resist pattern 212 and etching of the dielectric film 210 is quicker and less expensive than the patterning of numerous dummy chips, so the effect is obtained at a lower cost and with less impact on productivity.

Since the pattern density of the etched dielectric film 210 in the peripheral area 206 has to match the pattern density of the wiring pattern in the effective device area 202 only approximately, the same pattern and hence the same lithography mask can be used for different dielectric films, provided that the wiring layers insulated by the dielectric films have roughly similar pattern densities. Typically, the same lithography mask can be used for all of the inter-layer dielectric films that require chemical-mechanical polishing, as in the first embodiment.

Next, a third embodiment will be described. The third embodiment differs from the first embodiment in that the dielectric film is an STI oxide film.

Figure 26:
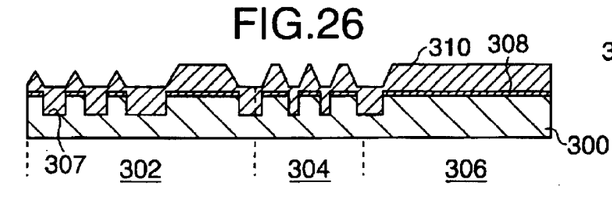
FIGS. 26, 28, 30, 32, and 33 are partial sectional views illustrating the etching and chemical-mechanical polishing of an inter-layer dielectric film according to a third embodiment of the invention.

Referring to FIG. 26, the semiconductor wafer 300 again comprises an effective device area 302 separated by grid lines 304 from a peripheral area 306. After shallow trenches 307 have been etched into the wafer, with a nitride film 308 serving as an etching mask, an oxide film 310 is deposited to fill the trenches with a dielectric material. The oxide-filled trenches 307 provide electrical isolation between active parts of the effective device area 302, which remain covered by the nitride film 308. Trenches are also formed within the grid lines 304 and at their boundaries, but no trenches are formed within the peripheral area 306.

The oxide film 310, which inherits the trench topography, is uniformly thick in the trench-free peripheral area 306, but has a smaller average thickness in the effective device area 302. In particular, the average thickness of the oxide film 310 above the level of the nitride film 308 is much less in the effective device area 302 than in the peripheral area 306.

Figure 27:
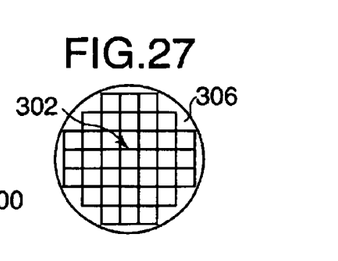
FIGS. 27, 29, and 31 are plan views corresponding to FIGS. 26, 28, and 30, respectively.

FIG. 27 shows a plan view of the wafer when both the effective device area 302 and the peripheral area 306 are covered by the oxide film.

Next, a chemical-mechanical polishing process (an STI-CMP process) is carried out to remove the oxide film 310 from above the level of the nitride film 308. It is particularly important to remove all of the oxide film 310 from the nitride film 308 in the effective device area 302, since any oxide remaining on the nitride film 308 in this area can interfere with the operation of transistors that will be formed later in the active areas.

Figure 28:
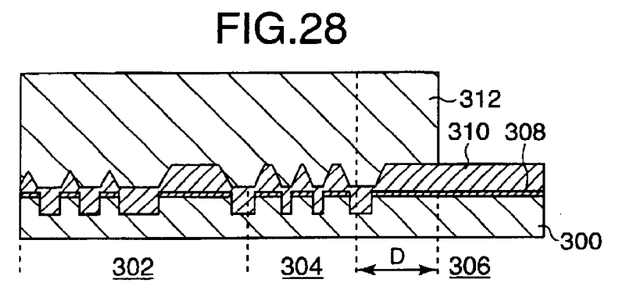
Figure 29:
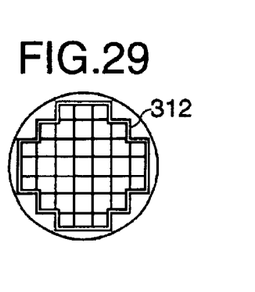

Referring to FIG. 28, before chemical-mechanical polishing, the wafer is coated with a layer of a photoresist material. The photoresist is patterned by single-exposure, whole-wafer lithography to form a resist pattern 312 covering the entire effective device area 302 and the grid lines 304 but extending only, for example, five micrometers (5 µm, distance D in the drawing) into the peripheral area 306. The distance D does not have to be accurately controlled, so the lithography mask does not have to be accurately aligned. FIG. 29 shows a plan view of the wafer after the resist pattern 312 has been formed.

Figure 30:
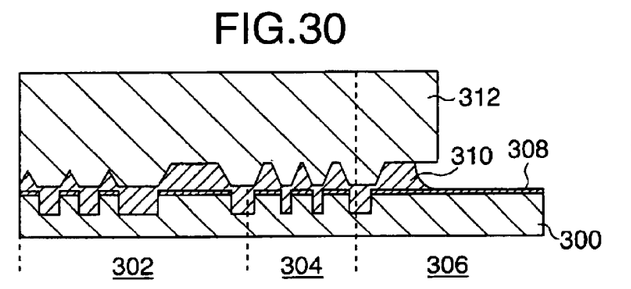
Figure 31:
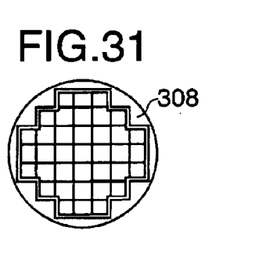

Referring to FIG. 30, a wet etching process is used to remove the exposed part of the oxide film 310 from the nitride film 308. The etching fluid etches the oxide film 310 at a much faster rate than the rate at which the nitride film 308 is etched, so the nitride film 308 functions as an etching stopper, and it is not necessary to control the etching time precisely. Etching also proceeds laterally, partly undercutting the resist pattern 312, but the overlap between the resist pattern 312 and the peripheral area 306 is adequate to protect the oxide in the trenches from being etched. FIG. 31 is a plan view of the wafer after this etching step, showing that the nitride film 308 is now exposed in the peripheral area.

Figure 32:
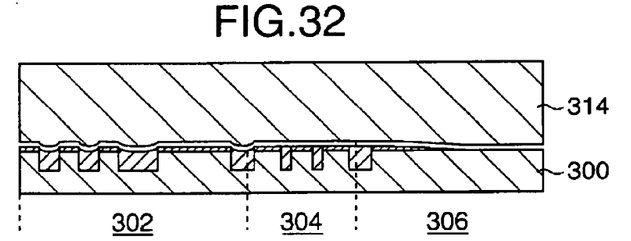

Referring to FIG. 32, the resist pattern 312 is removed and the wafer 300 is planarized by chemical-mechanical polishing, using a polishing pad 314 and slurry. Because the preceding etching step has removed most of the oxide film from the peripheral area 306, the outer parts of the effective device area 302 are polished with the same pressure as the central parts, despite the lack of trenches in the peripheral area 306.

Figure 33:
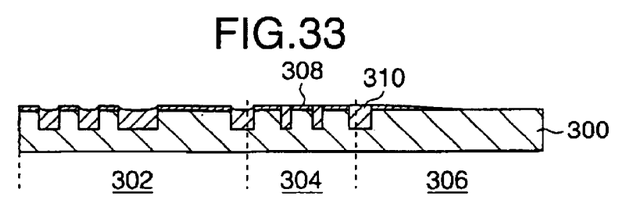

Referring to FIG. 33, at the end of the polishing process, all of the oxide film 310 has been removed from above the nitride film 308, leaving only the oxide material disposed in the isolation trenches. Correctly functioning transistors and other circuit elements can thus be formed throughout the effective device area 302. In outer parts of the peripheral area 306, the polishing process may have removed the nitride film 308 itself, as shown, but since no circuit elements will be created in the peripheral area 306, no particular damage is done, provided the polishing process does not proceed too far into the wafer substrate 300 in this area.

The third embodiment provides the same advantages for STI chemical-mechanical polishing as the first embodiment provides for IMD and PMD chemical-mechanical polishing: forming one resist pattern 312 is less costly than patterning the numerous dummy chips required in conventional manufacturing methods; and the oxide film 310 can be removed from the area in which the marking will be written, where dummy chips cannot be formed, enabling uniform planarity to be obtained throughout the effective device area 302.

The first and third embodiments of the invention may be practiced on the same wafer, in which case the same lithography mask can be employed to pattern both the oxide film 310 of the third embodiment and the IMD and PMD films 110 of the first embodiment.

Next, a fourth embodiment will be described. The fourth embodiment differs from the third embodiment in that the oxide film in the peripheral area is patterned instead of being uniformly etched.

Figure 34:
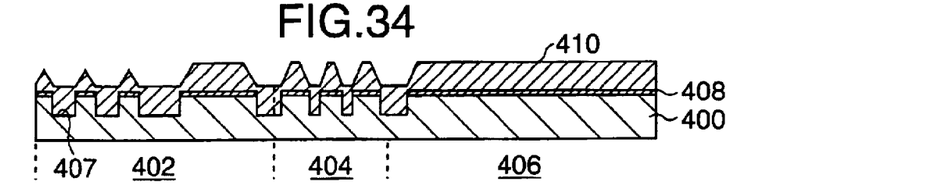
FIGS. 34, 35, 36, 37, and 38 are partial sectional views illustrating the etching and chemical-mechanical polishing of an inter-layer dielectric film according to a fourth embodiment of the invention.

Referring to FIG. 34, the semiconductor wafer 400 in the fourth embodiment includes an effective device area 402 separated by grid lines 404 from a peripheral area 406, as in the preceding embodiments. Shallow trenches 407 are formed in the effective device area 402 and grid lines 404, and at the boundaries of the grid lines, a nitride film 408 being used an etching mask. An oxide film 410 is deposited on the wafer to fill in the trenches 407 with a dielectric material.

Figure 35:
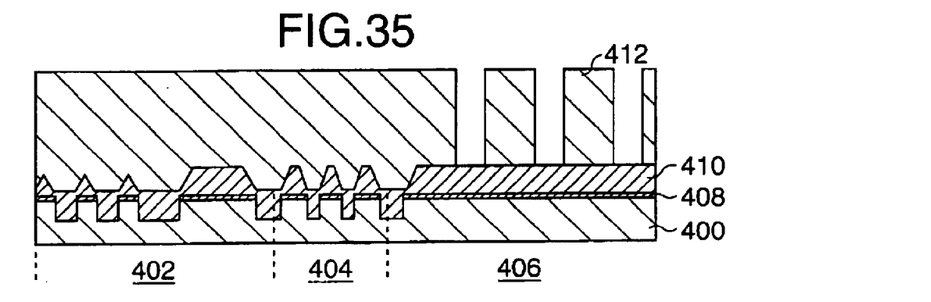

Referring to FIG. 35, the wafer is coated with a layer of a photoresist material, which is patterned by single-exposure, whole-wafer lithography to form a resist pattern 412. The resist pattern 412 covers the entire effective device area 402 and the grid lines 404, extends a short distance (e.g., 5 µm) over the peripheral area 406, and is patterned in, for example, a dot pattern or a line pattern over the rest of the peripheral area 406. The pattern need not be accurately formed or aligned, but its density should approximately match the trench pattern density in the effective device area 402.

Figure 36:
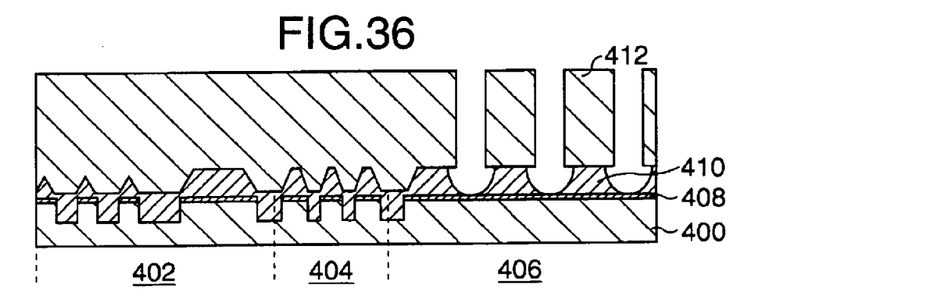

Referring to FIG. 36, a wet etching process is now used to remove the exposed part of the oxide film 410 from the nitride film 408. As in the third embodiment, the nitride film 408 functions as an etching stopper, so the etching time does not have to be precisely controlled. Lateral etching partly undercuts the resist pattern 412, but the overlap between the resist pattern 412 and the peripheral area 406 is adequate to protect the oxide in the trenches from being etched. After this etching step, the topography of the oxide film 410 in the peripheral area 406 generally resembles the topography of the oxide film 410 in the effective device area 402, having a similar pattern density.

Figure 37:
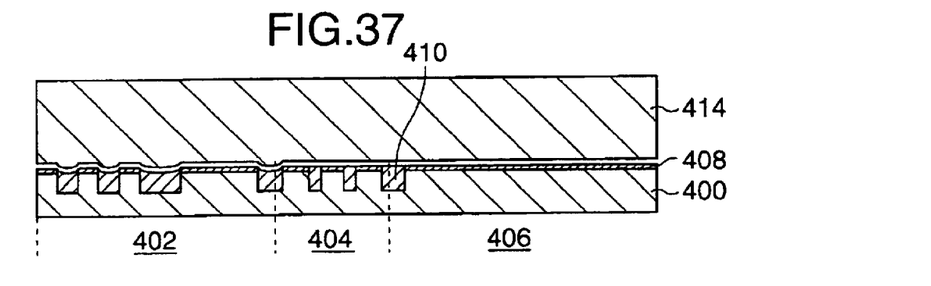

Referring to FIG. 37, after the resist pattern 412 is removed, the oxide film 410 is planarized by chemical-mechanical polishing, using a polishing pad 414 and slurry. Because of the similar pattern densities of the oxide film 410 in the effective device area 402 and peripheral area 406, the polishing proceeds at the same rate in all areas 402, 404, 406 of the wafer 400, removing all oxide from the nitride film 408 without removing the nitride film 408 itself.

Figure 38:
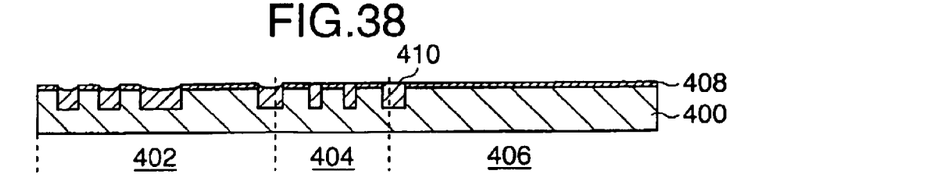

Referring to FIG. 38, at the end of the polishing process, the wafer 400 has a flat surface covered everywhere by the nitride film 408, except above the trenches 407, which are filled with oxide material. Compared with the third embodiment, the fourth embodiment has the advantage of improved planarity, and is easier to control since there is no risk that substrate material might be removed by over-polishing in the peripheral area 406.

The effect of the fourth embodiment is similar to the effect of dummy chips, but is obtained without the high costs associated with the alignment and patterning of dummy chips, as explained in the preceding embodiments.

If the second and fourth embodiments are employed to process the same wafer, in many cases it will be possible to use the same lithography mask to pattern the dielectric films 210, 410 polished in both embodiments.

The present invention is not limited to the preceding embodiments. For example, etching methods other than wet etching may be employed din the etching step, and those skilled in the art will recognize that further variations are possible within the scope claimed below.

What is claimed is:

1. A method of manufacturing at least one semiconductor device on a substrate having an effective device area surrounded by a peripheral area, said at least one semiconductor device being formed in the effective device area, the peripheral area extending to an outer periphery of the substrate, the method comprising:

forming a dielectric film entirely covering the substrate;

forming a resist pattern on the dielectric film, entirely covering the dielectric film in the effective device area and leaving at least part of the dielectric film exposed in the peripheral area, so that the exposed part of the dielectric film has an inner boundary that conforms with a shape of an outer boundary of the effective device area;

etching the exposed part of the dielectric film;

removing the resist pattern; and planarizing the dielectric film by chemical-mechanical polishing after the resist pattern has been removed.

2. The method of claim 1, wherein said etching is performed by wet etching.

3. The method of claim 1, wherein the resist pattern includes a section that extends from the effective device area into the peripheral area to entirely cover a portion of the dielectric film in the peripheral area, and exposes all parts of the dielectric film in the peripheral area beyond the section of the resist pattern.

4. The method of claim 3, wherein the section of the resist pattern extends from the effective device area substantially five micrometers into the peripheral area.

5. The method of claim 1, wherein the resist pattern includes a section that extends from the effective device area into the peripheral area to entirely cover a portion of the dielectric film in the peripheral area, the section of the resist pattern is also patterned to partly expose the dielectric film in the peripheral area beyond the section of the resist pattern.

6. The method of claim 5, wherein the section of the resist pattern extends from the effective device area into the peripheral area for substantially five micrometers.

7. The method of claim 1, wherein the dielectric film covers a wiring layer formed on the substrate.

8. The method of claim 7, wherein the dielectric film has an uneven surface topography with a base level disposed in a reference plane in the effective device area, and said etching etches the exposed part of the dielectric film in the peripheral area substantially down to the reference plane.

9. The method of claim 1, wherein the dielectric film fills isolation trenches formed in the effective device area of the substrate.

10. The method of claim 9, wherein parts of the substrate exterior to the isolation trenches are covered by a nitride film underlying the dielectric film, and the nitride film functions as an etching stopper during said etching.

11. The method of claim 1, wherein the resist pattern is formed by a single lithography exposure.

* * * * *